United States Patent
Barrenscheen

(10) Patent No.: US 7,420,498 B2
(45) Date of Patent: Sep. 2, 2008

(54) SIGNAL CONVERTER PERFORMING A ROLE

(75) Inventor: Jens Barrenscheen, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/603,635

(22) Filed: Nov. 22, 2006

(65) Prior Publication Data

US 2008/0117090 A1    May 22, 2008

(51) Int. Cl.
*H03M 1/12* (2006.01)
(52) U.S. Cl. .......................... 341/155; 341/159
(58) Field of Classification Search .................. 341/155, 341/156, 141, 164, 165, 160, 159
See application file for complete search history.

(56) References Cited

U.S. PATENT DOCUMENTS

| | | | | |
|---|---|---|---|---|
| 6,411,241 B1 * | 6/2002 | Taketoshi | .................... | 341/155 |
| 6,642,880 B1 * | 11/2003 | Edmonds | ..................... | 341/155 |
| 6,788,235 B1 * | 9/2004 | Barrenscheen et al. | ....... | 341/155 |
| 6,788,559 B2 * | 9/2004 | Sheng et al. | ................... | 363/72 |
| 6,798,371 B1 * | 9/2004 | Potlapalli et al. | ............ | 341/155 |
| 6,839,014 B2 * | 1/2005 | Uda | ........................... | 341/155 |
| 7,158,069 B2 * | 1/2007 | Confalonieri et al. | ........ | 341/155 |
| 7,245,248 B2 * | 7/2007 | Morita et al. | ................ | 341/155 |

* cited by examiner

*Primary Examiner*—Peguy JeanPierre
(74) *Attorney, Agent, or Firm*—Dicke, Billig & Czaja, PLLC

(57) ABSTRACT

A system with signal converter devices, in particular, ADCs (analog-to-digital converters), a device for use in a signal converter system, and a method for operating a signal converter system is disclosed. In one embodiment, a system with a plurality of signal converter devices is provided, each signal converter device being adapted to variably be assigned one of several predefined roles in the system.

18 Claims, 4 Drawing Sheets

SIGNAL CONVERTER PERFORMING A ROLE

BACKGROUND

The invention relates to a system with signal converter devices, in particular, ADCs (analog-to-digital converters), a device for use in a signal converter system, and a method for operating a signal converter system.

Conventional microcontroller or microprocessor systems comprise one or several CPUs (central processing units). The CPU(s) are connected to one or several memories, e.g. a program memory, and a data memory, etc.

The memories may be provided on the same chip, as the CPU(s) ("embedded" microcontroller or microprocessor system), or alternatively separately from the CPU(s).

The program memory, e.g., may store the series of instructions to be executed by the CPU(s) i.e., the program, and the data memory, e.g., respective variables, e.g., variables to be changed by the CPU(s) when executing the program.

In addition, conventional microcontroller or microprocessor systems often comprise one or several signal converter devices, e.g., ADCs (analog-to-digital converters).

By use of an ADC, a continuous input signal, e.g., an analog measuring voltage, a respective current signal, etc., can be converted into a digital number. The digital number then, e.g., might be processed by the CPU(s).

The number of different digital numbers an ADC can produce for the allowed range of a continuous input signal is called the "resolution" of the ADC. For example, an ADC that encodes an analog measuring voltage into one of 256 different digital numbers (0.255) has a resolution of eight bits, since $2^8=256$.

As the input signal is continuous in time, it is necessary to define the rate at which new digital numbers/new discrete values are to be sampled from the input signal. The rate of new values is called the "sampling rate" or "sampling frequency" of the ADC.

For some applications, it might be necessary to sample two or more different measuring voltages at the same time. Typical examples are the sampling of measuring voltages referring to two parallely measured phase currents of an AC motor, the position measurement with resolver, etc.

For these applications, several separate sample and hold devices might be used, whereby the sample and hold devices in parallel at the same capture the respective different measuring voltages, and sequentially provide the captured analog values to the ADC, for sequential conversion of the analog values into respective digital numbers. Alternatively, respective sample and hold devices might be provided on the ADC itself.

As a further alternative, several ADCs might be used, each ADC in parallel being provided with one of the above different measuring voltages, which are parallely sampled, and then converted in respective digital numbers.

An advantage of using several ADCs instead of several sample and hold devices is that more measurements/samplings can be performed within a given period of time.

However, when performing parallel measurements/samplings, the several ADCs need to be synchronized.

To synchronize the ADCs, a "master" ADC might be provided, and one or several "slave" ADCs. Whenever the master ADCs requests a parallel conversion/sampling from a slave ADC, the slave ADC performs the respective conversion at a predefined point of time (e.g., with respect to a system clock). When the master ADC does not request parallel conversion from the slave ADC, the respective slave ADC might perform separate, independent measurements. However, due to the predefined roles of the ADCs (as either "master" ADC, or "slave" ADC), the flexibility of the system is limited.

For these or other reasons, there is a need for the present invention.

SUMMARY

One embodiment provides a system with a plurality of signal converter devices, each signal converter device being adapted to variably be assigned one of several predefined roles in the system.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION

In the following Detailed Description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1:
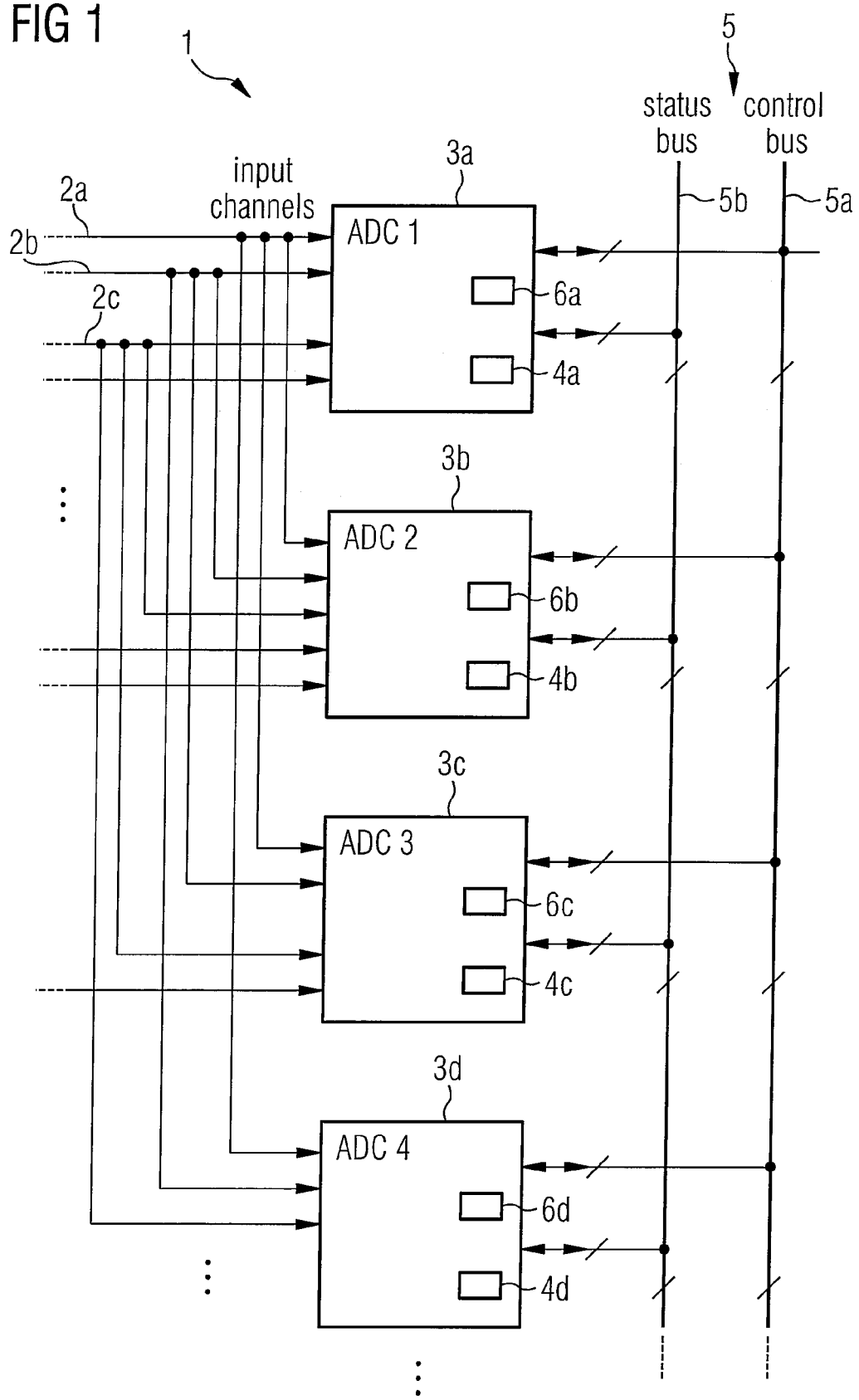
FIG. 1 schematically illustrates a system with ADCs (analog-to-digital converters) according to one embodiment of the invention.

FIG. 1 illustrates a schematic, exemplary representation of a system 1 with several ADCs (analog-to-digital converters) 3a, 3b, 3c, 3d according to one embodiment of the invention.

Each ADC 3a, 3b, 3c, 3d is capable of converting a continuous input signal, e.g., an analog measuring voltage, a respective current signal, etc. provided to a respective ADC 3a, 3b, 3c, 3d via one of a plurality of input channels 2a, 2b, 2c, into a respective digital number. The digital number may then be stored in a respective one of several output registers 4a, 4b, 4c, 4d of the ADC 3a, 3b, 3c, 3d. Later on, the digital number may, e.g., be read out and further processed by a respective microprocessor or microcontroller of a microcontroller or microprocessor system.

The ADCs 3a, 3b, 3c, 3d may be provided on one and the same chip, or alternatively on separate chips.

The system 1 may include a fixed number of ADCs 3a, 3b, 3c, 3d, e.g., two, three, four or more ADCs. Alternatively, the number of ADCs 3a, 3b, 3c, 3d in the system is variably adjustable (such that the system 1 variably e.g. might comprise two, three, four or more ADCs).

As will be described in further detail below, each ADC 3a, 3b, 3c, 3d is constructed similar or substantially similar. However, as also will be described in further detail below, each ADC 3a, 3b, 3c, 3d may be programmed differently, such as to assign one of several predefined roles to a respective ADC.

In particular, as will be described in further detail below, to each ADC 3a, 3b, 3c, 3d variably the role of a "master" ADC, or the role of a "slave" ADC, or the role of an "autonomous" ADC may be assigned. Hence, for example, to the first ADC 3a ("ADC 1") according to the specific needs of a first application the role of a "master" ADC might be assigned, whilst according to the specific needs of a second application, different from the first application to the same ADC 3a ("ADC 1") the role of a "slave" ADC might be assigned.

As also will be described in further detail below, to each "master" ADC, one or several variably selectable "slave" ADCs might be assigned. Hence, for example, when the role of a "master" ADC is assigned to the first ADC 3a ("ADC 1"), according to the specific needs of a third application, e.g., a second ADC 3b ("ADC 2") might be assigned as "slave" ADC to the first ADC 3a ("ADC 1"), whilst according to the specific needs of a fourth application, different from the third application, a third and fourth ADC 3c, 3d ("ADC 3" and "ADC4") might be assigned as "slave" ADCs to the first ADC 3a ("ADC 1"), etc.

The total number of ADCs to which the role of a "master" ADC, and/or the total number of ADCs to which the role of a "slave" ADC is assigned is variable.

A "master" ADC and the one or several "slave" ADCs assigned to this "master" ADC form a respective "synchronization group". As follows from the above explanation, the total number of "synchronization groups" of the system. 1 is variably adjustable.

As is illustrated in FIG. 1, for synchronization of the one or several "master" ADCs with their respective one or several associated "slave" ADCs—in particular, for carrying out a respective parallel conversion, a bus system 5 is provided, connecting each of the ADCs 3a, 3b, 3c, 3d of the system 1.

The bus system 5 includes a control bus 5a, by use of which respective control signals referring to a respective set of control data provided by a respective "master" ADC might be sent from the respective "master" ADC to all other ADCs of the system 1. The set of control data in general only is evaluated taken into account by the one or several "slave" ADCs associated with the respective "master" ADC that sends out the control signals (i.e., the one or several "slave" ADCs that belong to the same synchronization group, as the respective "master" ADC). In the one or several associated "slave" ADCs, the received set of control data is used to control the respective analog-to-digital conversion to be performed (e.g., with regards to channel selection, sampling rate, resolution, timing, etc.). Further, a respective "master" ADC ignores respective sets of control data received via the control bus 5a. Instead, a respective "master" ADC uses his "own" set of control data (i.e., the above set of control data, e.g. stored in respective registers of the respective "master" ADC, and sent by the respective "master" ADC to the other ADCs via the control bus 5a) to control the respective analog-to-digital conversion to be performed in the respective "master" ADC.

Hence, the analog-to-digital conversions of a respective synchronization group (comprising a respective "master" ADC, and one or several associated "slave" ADCs) is controlled by one single set of control data, provided by the respective "master" ADC of the respective synchronization group.

In contrast, in an "autonomous" ADC to which neither the role of a "master" ADC, nor the role of a "slave" ADC was assigned (or more precisely, the role of a "master" ADC without any associated "slave" ADC) only a respective "own" set of control data (i.e., only a set of control data stored in respective registers of the respective ADC) is used to control the respective analog-to-digital conversion to be performed.

As is further illustrated in FIG. 1, the bus system 5 in addition to the control bus 5a includes a status bus 5b, by use of which respective status signals referring to status information data, e.g., provided by a respective "slave" ADC might be sent from the respective "slave" ADC to all other ADCs of the system 1. The status information data in general only is evaluated/taken into account by the "master" ADC associated with the "slave" ADC that sends out the status signals (i.e., the "master" ADC that belongs to the same synchronization group, as the respective "slave" ADC). With the status information data, it might be signalized that a respective "slave" ADC is idle/ready for a new conversion, or not idle/not ready for a new conversion (e.g., because the previous conversion has not yet been finished).

In the "master" ADC, it is checked by use of the status information data received from all associated "slave" ADCs whether or not all associated "slave" ADCs are idle/ready for new conversions. If one or several associated "slave" ADCs are not idle/not ready, the "master" ADC waits till it receives from all associated "slave" ADCs respective status information data that show that all associated "slave" ADCs are idle/ready for new conversions. Only then, and if the "master" ADC itself is idle/ready for a new conversion the "master" ADC starts a respective (parallel) conversion (and correspondingly similar (i.e., in parallel) the associated "slave" ADCs (see below)).

Hence, simultaneous, parallel conversions are carried out by all ADCs of the same synchronization group, with the respective sampling phases starting at the same moment. Thereby, respective continuous input signals provided at one and the same, or different input channels 2a, 2b, 2c (see below) are converted into respective digital numbers, and stored in the corresponding output registers 4a, 4b, 4c, 4d.

Thereby, it might be achieved that two or more different measuring voltages provided at respective input channels 2a, 2b, 2c are sampled at the same time (e.g., two parallely measured—phase currents of an AC motor, several parallely measured—resolver voltages etc.).

In contrast to a "master" or "slave" ADC, an "autonomous" ADC need not evaluate/take into account any status information data provided via the status bus 5b. Hence, an "autonomous" ADC might start a conversion irrespective of status information provided by other ADCs.

As will be described in further detail below, to assign the above roles ("master", "slave", or "autonomous") to the ADCs 3a, 3b, 3c, 3d, and to synchronize the ADCs 3a, 3b, 3c, 3d of a synchronization group, each ADC 3a, 3b, 3c, 3d includes a respective synchronization register 6a, 6b, 6c, 6d (see also FIG. 2). The synchronization registers 6a, 6b, 6c, 6d of the ADCs 3a, 3b, 3c, 3d might be variably programmed by the microprocessor/microcontroller of the above microcontroller or microprocessor system during normal operation of the system. Hence, the data stored in the synchronization registers 6a, 6b, 6c, 6d according to specific needs of a respective application might be altered during the runtime of the system.

Figure 3:
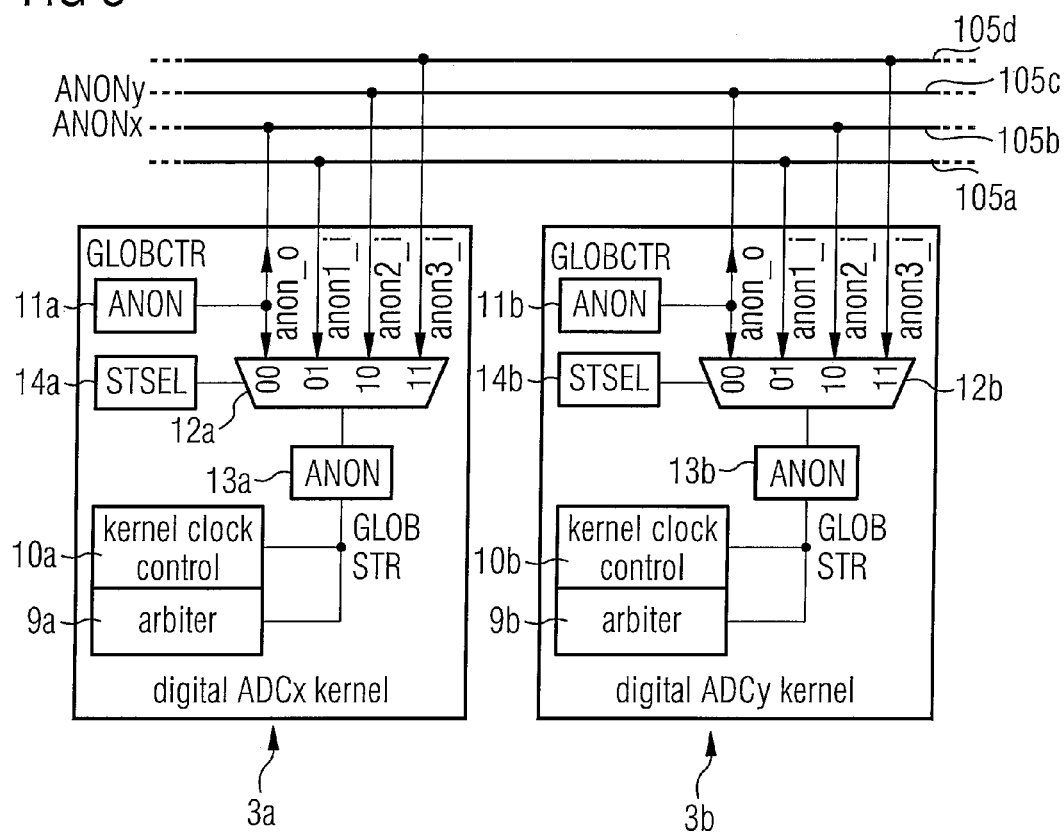
FIG. 3 schematically illustrates a portion of a first and a second ADC illustrated in FIG. 1.
Figure 4:
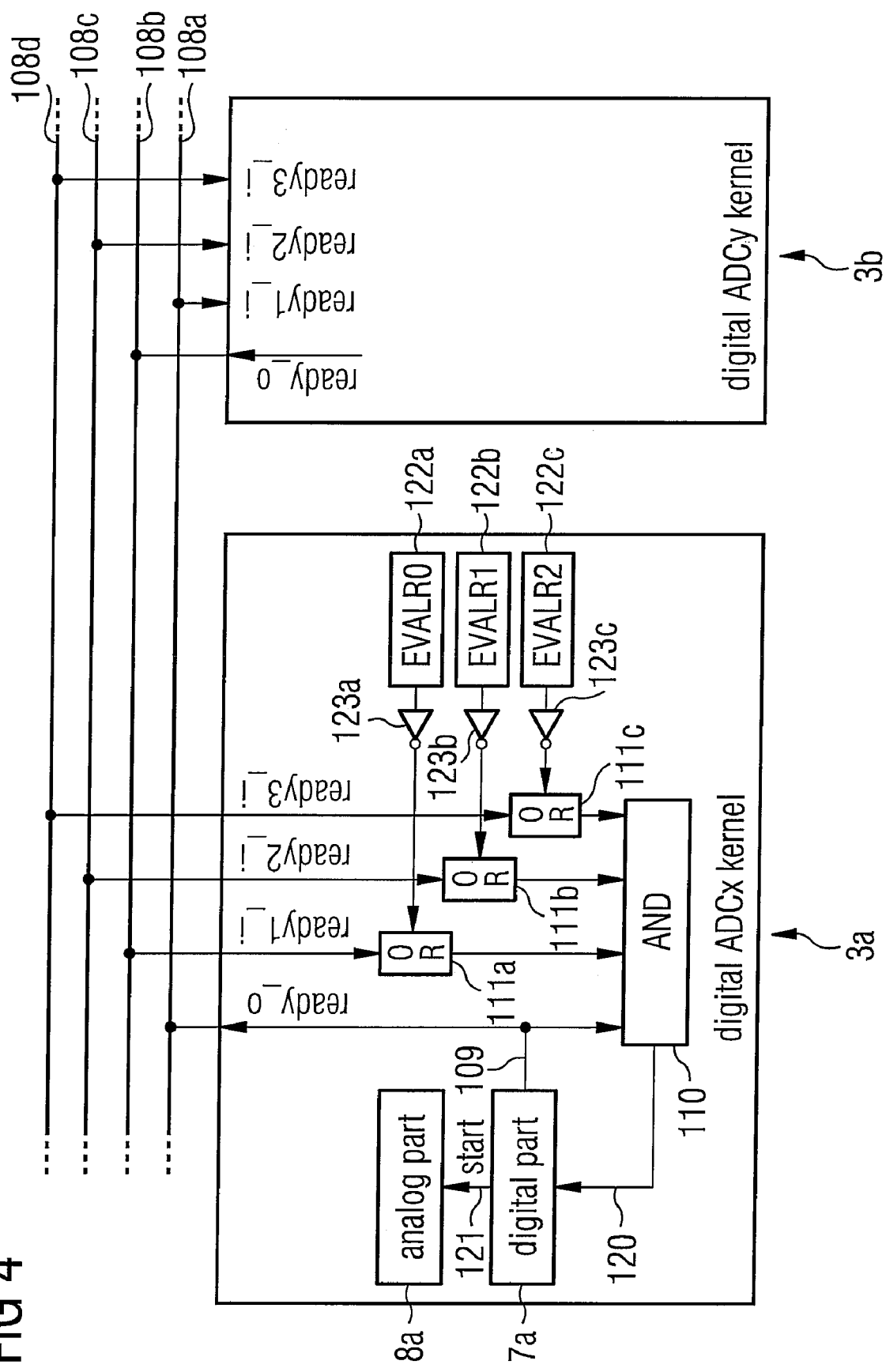
FIG. 4 schematically illustrates a further portion of the first and second ADC illustrated in FIG. 1.
Figure 5:
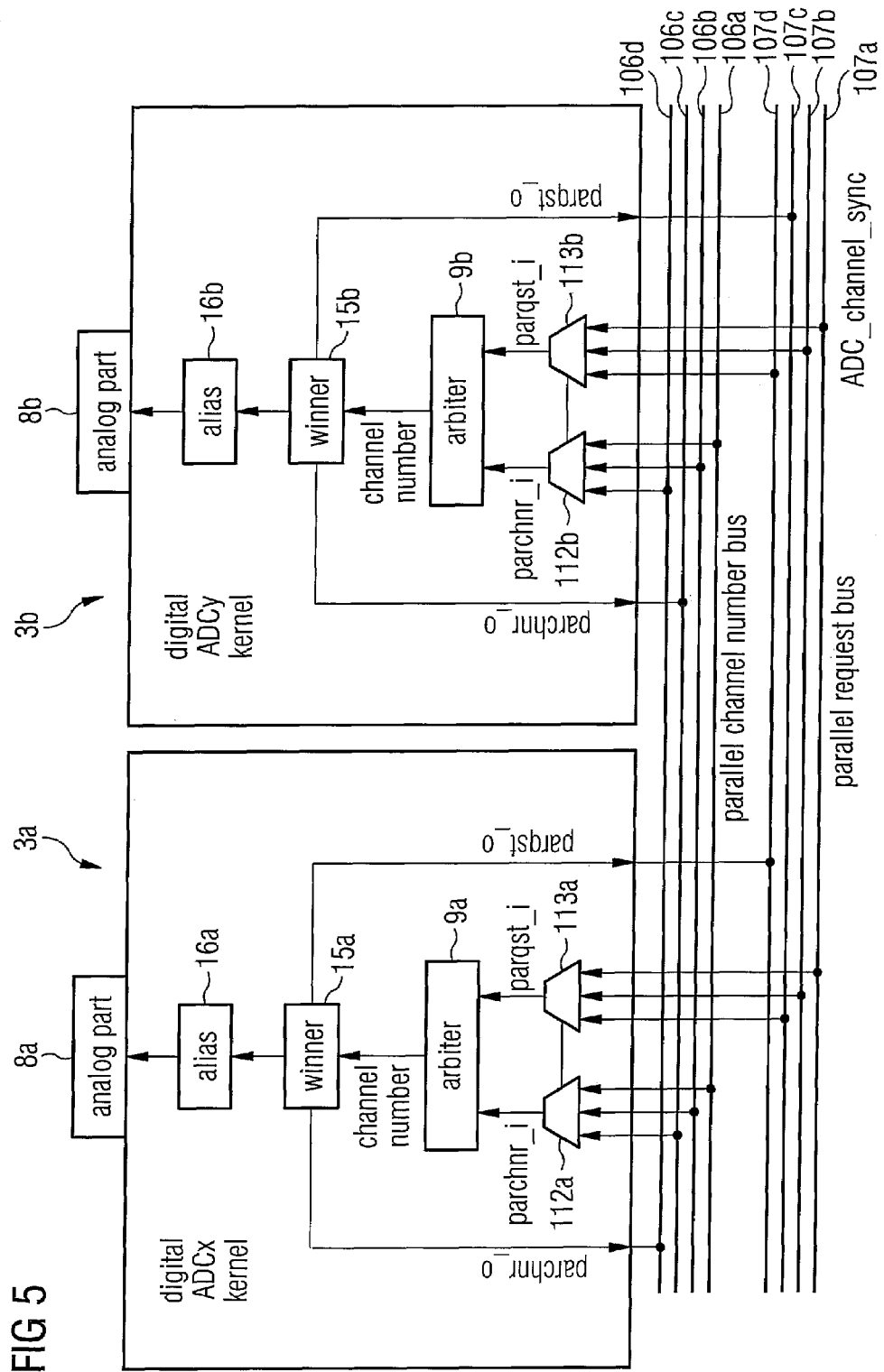
FIG. 5 schematically illustrates a still further portion of the first and second ADC illustrated in FIG. 1.

As is illustrated in FIGS. 3, 4 and 5, each ADC 3a, 3b, 3c, 3d correspondingly similar as conventional ADCs comprises a digital part 7a, an analog part 8a, 8b, and an arbiter 9a, 9b. The arbiter 9a, 9b e.g. decides which conversion is to be started next in a respective ADC 3a, 3b, 3c, 3d.

For synchronizing purposes, the arbiters 9a, 9b of ADCs of the same synchronization group have to run/have to be started in parallel (or more exactly: the state machines of the respective arbiters 9a, 9b). The same e.g. applies to the analog parts 8a, 8b (e.g., to internal dividers comprised in the analog parts 8a, 8b of ADCs of the same synchronization group/to ADC kernel clocks, controlled by respective kernel clock controls 10a, 10b of the respective ADCs, etc. (see FIG. 3)).

For carrying out a synchronized start of the arbiters 9a, 9b/analog parts 8a, 8b, etc., a variable ANON (Analog On) stored in a register 11a, 11b of a respective ADC is set to a first, predefined value, e.g., to "$00_B$" (see FIG. 3).

As will be described in further detail below, if a respective ADC is a "master" ADC or an "autonomous" ADC, the value stored in the register 11a, 11b (e.g., the above first, predefined value "$00_B$") is supplied via a multiplexer 12a, 12b to a further register 13a, 13b, stored therein, and supplied to the respective arbiter 9a, 9b, and the respective kernel clock control 10a, 10b of the respective "master"/"autonomous" ADC.

In response to receiving the above first, predefined value (e.g., the above value "$00_B$") from the further register 13a, 13b, the above internal dividers, arbiter state machines, etc. are brought to a predefined initial state, and the respective analog part 8a, 8b is switched off.

As can be seen from FIG. 3, the a variable ANON (Analog On) stored in the register 11a, 11b of a respective ADC is not only as said above provided to the multiplexer 12a, 12b of the respective ADC, but also via respective lines 105a, 105b, 105c, 105d (lines ANONx, ANONy, etc.) of the above buses 5a, 5b to all other ADCs of the system (more particularly, to respective inputs of the respective multiplexers 12a, 12b provided in the ADCs 3a, 3b, 3c, 3d). For example, as is illustrated in FIG. 3, the variable ANON (Analog On) stored in the register 11a of the first ADC 3a is provided to a first input (anon_0) of the multiplexer 12a of the first ADC 3a, and via lines 105b of the above buses 5a, 5b e.g. to a third input (anon2_i) of the multiplexer 12b of the above second ADC 3b, etc. Further, as is also illustrated in FIG. 3, the variable ANON (Analog On) stored in the register 11b of the second ADC 3b is provided to a first input (anon_0) of the multiplexer 12b of the second ADC 3b, and via lines 105c of the above buses 5a, 5b e.g. to a third input (anon2_i) of the multiplexer 12a of the above first ADC 3a, etc., etc. This as will be described in further detail below allows the parallel setting of variables in several different ADCs with one single CPU access.

Figure 2:
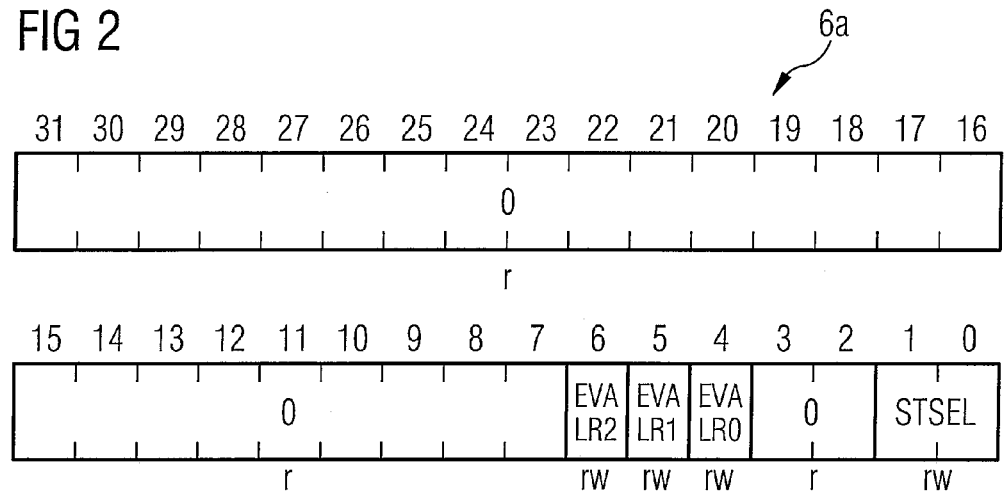
FIG. 2 schematically illustrates a synchronization register of an ADC illustrated in FIG. 1.

Which of the values present at the inputs (anon_0, anon1_i, anon2_i, anon3_i) of a respective multiplexer 12a, 12b is supplied via the multiplexer 12a, 12b to the above further register 13a, 13b depends on the value of a variable STSEL stored in a register 14a, 14b, i.e., a read/writable variable STSEL which as is illustrated in FIG. 2 is part of the variables stored in the above synchronization register 6a, 6b of the respective ADC 3a, 3b.

If the respective ADC 3a, 3b is to take the role of a "master" ADC, or an "autonomous" ADC, the value of the variable STSEL stored in the register 14a, 14b of the respective ADC is set to a first, predefined value, e.g., to "$00_B$". In this emodiment, the value present at the first input (anon_0) of a respective multiplexer 12a, 12b, i.e., the value of the variable ANON (Analog On) stored in the above register 11a, 11b is supplied via the multiplexer 12a, 12b to the above further register 13a, 13b.

If, instead, the respective ADC 3a, 3b is to take the role of a "slave" ADC of a "master" ADC, the value of the variable STSEL stored in the register 14a, 14b of the respective ADC is set to a further, predefined value, e.g., to "$01_B$", "$10_B$", or "$11_B$". If the value stored in the register 14a, 14b e.g. is "$01_B$", the value present at the second input (anon1_i) of a respective multiplexer 12a, 12b is supplied via the multiplexer 12a, 12b to the above further register 13a, 13b. If, however, the value stored in the register 14a, 14b e.g. is "$10_B$", the value present at the third input (anon2_i) of a respective multiplexer 12a, 12b is supplied via the multiplexer 12a, 12b to the above further register 13a, 13b, and if the value stored in the register 14a, 14b e.g. is "$11_B$", the value present at the fourth input (anon3_i) of a respective multiplexer 12a, 12b is supplied via the multiplexer 12a, 12b to the above further register 13a, 13b.

In particular, the value of the variable STSEL stored in the register 14a, 14b of a respective "slave" ADC is chosen such that by the respective multiplexer 12a, 12b the value of the variable ANON provided by the "master" ADC associated with the respective "slave" ADC, i.e., the "master" ADC of the same synchronization group as the respective "slave" ADC (which variable as said above is supplied at the above lines 105a, 105b, 105c, 105d) is provided to the register 13a, 13b.

Hence, if a respective ADC is a "slave" ADC, and when as said above the corresponding "master" ADC in sets the value of the variable ANON stored in the register 11a, 11b to the above first, predefined value "$00_B$", this value is supplied via the lines 105a, 105b, 105c, 105d, and the respective multiplexer 12a, 12b of the "slave" ADC to the "slave" ADC's (further) register 13a, 13b. Further, correspondingly similar as explained above with respect to the associated "master" ADC, the value (here: "$00_B$") from the register 13a, 13b is supplied to the respective arbiter 9a, 9b, and the respective kernel clock control 10a, 10b of the "slave" ADC.

In response to receiving the above first, predefined value (here: "$00_B$") from the further register 13a, 13b, the above internal dividers, arbiter state machines, etc. of the "slave" ADC correspondingly similar as is the case in the "master" ADC, and parallel thereto (see explanations above) are brought to a predefined initial state, and the respective analog part 8a, 8b is switched off.

For actually starting the arbiters 9a, 9b/analog parts 8a, 8b of an "autonomous" ADC, or for simultaneously starting the arbiters 9a, 9b/analog parts 8a, 8b of a "master" ADC, and the respective "slave" ADCs, after the above-mentioned first step setting the variable ANON (Analog On) of the register 11a, 11b to the above first, predefined value "$00_B$" the variable ANON (Analog On) of the register 11a, 11b of the respective "autonomous" or "master" ADC is brought in accordance with the internal settings of the respective "autonomous" or "master" ADC from the above first value ("$00_B$"), to a second value, different from the first value (e.g., to a value corresponding to the value of a variable stored in a register with the address GLOBALCTR, programmed in the respective ADC).

As follows from the above explanations, as the respective ADC is an "autonomous" or "master" ADC (with the value of the variable STSEL stored in the register 14a, 14b being set to "$00_B$", correspondingly controlling the multiplexer 12a, 12b), the new value stored in the register 11a, 11b (i.e., the value of the variable stored in the register with the address GLOBALCTR) is supplied via the multiplexer 12a, 12b to the further register 13a, 13b, stored therein, and supplied to the respective arbiter 9a, 9b, and the respective kernel clock control 10a, 10b of the "autonomous" or "master" ADC.

In response to receiving the above value of the variable stored in the register with the address GLOBALCTR from the further register 13a, 13b, the above internal dividers, arbiter state machines, etc. start to run, in accordance with the settings defined by the variable stored in the register with the address GLOBALCTR. Hence, the respective analog part 8a, 8b is switched on.

As also follows from the above explanations, if a respective ADC is a "slave" ADC, and if as said above the corresponding "master" ADC in the above second step has set the value of the variable ANON stored in the register 11a, 11b to the above second value (i.e., the value of the variable stored in the register with the address GLOBALCTR), this value due to the above setting of the respective register 14a, 14b controlling the respective multiplexer 12a, 12b of the "slave" ADC is supplied via the lines 105a, 105b, 105c, 105d, and the respective multiplexer 12a, 12b of the "slave" ADC to the "slave" ADC's (further) register 13a, 13b. Further, correspondingly similar as explained above with respect to the associated "master" ADC, this new value (i.e., the value of the variable stored in the register with the address GLOBALCTR) from the register 13a, 13b is supplied to the respective arbiter 9a, 9b, and the respective kernel clock control 10a, 10b of the "slave" ADC.

In response to receiving the above value of the variable stored in the register with the address GLOBALCTR from the further register 13a, 13b, the above internal dividers, arbiter state machines, etc. of the "slave" ADC —simultaneously with the dividers, state machines, etc. of the associated "master" ADC start to run, in accordance with the settings defined by the variable stored in the register with the address GLOBALCTR provided by the "master" ADC. Hence, the respective analog part 8a, 8b of the "slave" ADC in parallel to the analog part 8a, 8b of the "master" ADC (and with corresponding settings)—is switched on.

Summarized, the above variables STSEL stored in the registers 14a, 14b controlling the multiplexers 12a, 12b define which signal from which source is used to start a respective ADC kernel.

Correspondingly similar as in conventional ADCs, in the arbiter 9a, 9b of the ADCs 3a, 3b, 3c, 3d of the system 1, it is detected which conversion request has the highest priority, and which input channel number is associated to the respective conversion request.

The detected channel number as illustrated in FIG. 5—is provided from the arbiter 9a, 9b to a register 15a, 15b, and from this register 15a, 15b to an alias module 16a, 16b, and in unmodified form, or, if the alias function of the alias module is active, in a modified form (see below)—to the respective analog part 8a, 8b of the ADC 3a, 3b, 3c, 3d.

The analog part 8a, 8b then converts the continuous input signal present at the respective input channel 2a, 2b, 2c as specified by the received channel number into a respective digital number, which as said above is then stored in the output registers 4a, 4b, 4c, 4d of the ADC 3a, 3b, 3c, 3d.

If the alias function of the alias module 16a, 16b is active, it is not the channel number as detected by the arbiter 9a, 9b that is provided to the analog part 8a, 8b, but a modified channel number, i.e., a channel number different to the channel number provided by the arbiter 9a, 9b, but associated to this channel number, and stored in a corresponding variably programmable alias register of the alias module 16a, 16b.

In this case, the analog part 8a, 8b converts the input signal present at an input channel 2a, 2b, 2c as specified by the modified channel number (i.e., at a different input channel, as specified by the unmodified channel number).

As can be seen from FIG. 5, the channel number as detected by the arbiter 9a, 9b of an ADC 3a, 3b, 3c not only is provided from the respective register 15a, 15b to the corresponding alias module 16a, 16b the analog part 8a, 8b, but also via respective lines 106a, 106b, 106c, 106d of the above buses 5a, 5b (in particular, a parallel channel number sub-bus) to all other ADCs of the system (more particularly, to respective inputs of respective further multiplexers 112a, 112b provided in the ADCs 3a, 3b, 3c, 3d).

For instance, as is by way of example illustrated in FIG. 5, the channel number parchnr_o stored in the register 15a of the first ADC 3a is provided via lines 106d of the above bus e.g. to a first input of the multiplexer 112b of the above second ADC 3b, etc. Further, as is also illustrated in FIG. 5, the channel number parchnr_o stored in the register 15b of the second ADC 3b is provided via lines 106c of the above bus e.g. to a first input of the multiplexer 112a of the above first ADC 3a, etc., etc.

Which of the values present at the inputs of a respective multiplexer 112a, 112b is supplied via the multiplexer 112a, 112b to the respective arbiter 9a, 9b (and if at all any of the values is supplied to the respective arbiter 9a, 9b (see below)) again may depend on the value of the above variable STSEL of the respective ADC, i.e., the read/writable variable STSEL which as is illustrated in FIG. 2 is part of the variables stored in the above synchronization register 6a, 6b of the respective ADC 3a, 3b.

Correspondingly similar as was explained above, the value of the variable STSEL of a respective "slave" ADC e.g. might be chosen such that by the respective multiplexer 112a, 112b the channel number parchnr_o as provided by the "master" ADC associated with the respective "slave" ADC, i.e., the "master" ADC of the same synchronization group as the respective "slave" ADC (which channel number as said above is supplied at the above lines 106a, 106b, 106c, 106d) is provided to the respective arbiter 9a, 9b of the "slave" ADC.

Further, the variable STSEL of a "master" ADC e.g. is chosen such that the values provided on the above parallel channel number sub-bus/the lines 106a, 106b, 106c, 106d are ignored, i.e., not provided by the respective multiplexer 112a, 112b to the respective arbiter 9a, 9b of the "master" ADC.

A respective arbiter 9a, 9b in addition to detecting, as said above, which conversion request has the highest priority, and which input channel number is associated to the respective conversion request also detects whether the detected input channel is programmed as source for a parallel conversion.

As is illustrated in FIG. 5, if it is detected by a respective arbiter 9a, 9b that the detected input channel is programmed as source for a parallel conversion, and if the respective ADC comprising this arbiter 9a, 9b is a "master" ADC, a parallel request signal parqst_o provided on a respective parallel request line is activated.

The parallel request signal parqst_o is provided from the respective "master" ADC—via respective lines 107a, 107b, 107c, 107d of the above buses 5a, 5b (in particular, a parallel request sub-bus) to all other ADCs of the system (more particularly, to respective inputs of respective additional multiplexers 113a, 113b provided in the ADCs 3a, 3b, 3c, 3d).

For instance, as is by way of example illustrated in FIG. 5, the parallel request signal parqst_o provided by the first ADC 3a is provided via a line 107d of the above parallel request sub-bus e.g. to a first input of the multiplexer 113b of the above second ADC 3b, etc. Further, as is also illustrated in FIG. 5, the parallel request signal parqst-o provided by the second ADC 3b is provided via a line 107c of the above parallel request sub-bus, e.g. to a first input of the multiplexer 113a of the above first ADC 3a, etc., etc.

Whether or not a respective parallel request signal parqst_o is provided from the respective multiplexer I 13a, 113b to the respective arbiter 9a, 9b of an ADC again may depend on the value of the above variable STSEL of the respective ADC, i.e., the read/writable variable STSEL which as is illustrated in FIG. 2 is part of the variables stored in the above synchronization register 6a, 6b of the respective ADC 3a, 3b.

Correspondingly similar as was explained above, the value of the variable STSEL of a respective "slave" ADC e.g. might be chosen such that by the respective multiplexer 113a, 113b only a parallel request signal parqst_o of a "master" ADC associated with the respective "slave" ADC i.e., the "master" ADC of the same synchronization group as the respective "slave" ADC—is provided to the respective arbiter 9a, 9b of the "slave" ADC.

Further, the variable STSEL of a "master" ADC e.g. is chosen such that the signals provided on the above parallel request sub-bus/the lines 107a, 107b, 107c, 107d are ignored, i.e., not provided by the respective multiplexer 113a, 113b to the respective arbiter 9a, 9b of the "master" ADC.

If the respective multiplexers 112a, 112b, 113a, 113b of a "slave" ADC as explained above forward a respective parallel request signal parqst_o, and the associated channel number parchnr_o—both as said received from the "master" ADC associated with the respective "slave" ADC to the arbiter 9a, 9b of the "slave" ADC, the arbiter of the "slave" ADC regardless of other requests—detects the associated (parallel) conversion request from the "master" ADC as the request which has the highest priority.

Hence, the channel number received from the associated "master" ADC correspondingly similar as explained above is provided from the arbiter 9a, 9b of the "slave" ADC via the above register 15a, 15b to the respective alias module 16a, 16b, and from the alias module in modified or unmodified form (see explanations above) to the respective analog part 8a, 8b of the "slave" ADC.

The analog part 8a, 8b of the "slave" ADC parallel to the "master" ADC then converts the continuous input signal present at the respective input channel 2a, 2b, 2c as specified by the received modified or unmodified channel number into a respective digital number, which as said above is then stored in the output registers 4a, 4b, 4c, 4d of the "slave" ADC.

Hence, all ADCs of a synchronization group request the same channel number (as defined by the "master" ADC), but if this channel number is modified by respective alias modules 16a, 16b may convert signals from different input channels 2a, 2b, 2c. In other words, as explained above, a requested channel number may be redirected by the alias setting of a respective alias module 16a, 16b.

To ensure parallel conversions, the frequencies used by respective clock generators in all ADCs of a respective synchronization group should be identical. Hence, respective registers in the ADCs defining these frequencies have to be programmed to identical values.

Advantageously, a parallel conversion once started may not be aborted by the "master" ADC, even if the "master" ADC after having started the parallel conversion receives a request with higher priority, than the request associated with the parallel conversion.

Any "master" ADC can work autonomously (without the associated "slave" ADCS), or if needed can work together with the associated "slaves" ADCs.

If a "slave" ADC does not receive a parallel conversion request from an associated "master" ADC, the arbiter 9a, 9b of the respective "slave" ADC can detect a conversion request of the "slave" ADC itself as a request with highest priority. Hence, the respective "slave" ADC then may carry out its own requests.

If a "slave" ADC which is not idle, and which currently carries out a conversion related to an own request receives a parallel conversion request from the associated "master" ADC, the parallel conversion request leads to a "cancel-repaeat" of the currently carried out conversion in the respective "slave" ADC. Hence, the currently carried out conversion is cancelled, and restarted after finishing of the parallel conversion requested by the "master" ADC. Thus, it can be achieved that a "slave" ADC currently carrying out a conversion with a relatively long sampling phase (due to e.g. a relatively high impedance of the respective source) does not block a relatively important parallel conversion.

In a "master" or "autonomous" ADC, a "wait-for-read" functionality may be supported. The "wait-for-read" functionality may be activated by correspondingly programming a respective register. If the "wait-for-read" functionality is activated, a new conversion/a new parallel conversion is only carried out if the result of the previous conversion was already read out from the respective output register 4a, 4b, 4c, 4d (e.g., by the above microprocessor/microcontroller).

In contrast thereto, in a "slave" ADC, an activated "wait-for-read" may be ignored, in particular, when a parallel conversion is to be carried out. Hence even if the "wait-for-read" functionality is activated a new (parallel) conversion may be carried out, and the result of the conversion may be written in a respective output register 4a, 4b, 4c, 4d even if the result of the previous conversion has not yet been read out from this register 4a, 4b, 4c, 4d (hence, the previous result is overwritten).

The actual start of a conversion/parallel conversion is triggered as illustrated in FIG. 4 by the digital part 7a, 7b of a respective ADC 3a, 3b. A start is triggered by the respective digital part 7a, 7b if the corresponding analog part 8a, 8b of the respective ADC (and the analog parts of the other ADCs of the same synchronization group, if any (see below)) are ready to start a new conversion.

If it is detected by the digital part 7a, 7b that the corresponding analog part 8a, 8b is ready for a new conversion, the respective digital part 7a, 7b sends out a "ready" signal ready_o on a line 109.

As can be seen from FIG. 4, the ready signal ready_o is provided to a first input of an AND-Gate 110 of the respective ADC. Further, the ready signal ready_o is sent via a line 108a of the above buses 5a, 5b to all other ADCs of the system (more particularly, to respective inputs of respective OR-Gates 111a, 111b, 111c provided in the ADCs 3a, 3b, 3c, 3d).

For instance, as is by way of example illustrated in FIG. 4, a ready signal provided by the digital part 7a of the first ADC 3a is provided via the line 108a of the above bus e.g. to a first input of a first OR-Gate of the above second ADC 3b, and e.g. to a first input of a second OR-Gate of the above third ADC 3c, etc. Further, as is also illustrated in FIG. 4, a ready signal provided by the digital part of the second ADC 3b is provided via a further line 108b of the above bus, e.g., to a first input of a first OR-Gate 111a of the above first ADC 3a, and e.g. to a first input of a first OR-Gate of the above third ADC 3c, etc., etc.

As is further illustrated in FIG. 4, to respective second inputs of the above OR-Gates 111a, 111b, 111c, an inverted output of respective registers 122a, 122b, 122c is provided.

In the registers 122a, 122b, 122c respective variables EVALR0, EVALR1, EVALR2 are stored, here: respective read/writable variables EVALR0, EVALR1, EVALR2 which as is shown in FIG. 2 are part of the variables stored in the above synchronization register 6a, 6b of the respective ADC 3a, 3b.

If an ADC is to be an "autonomous" ADC, the values stored in the registers 122a, 122b, 122c are all set to a first, predefined value, e.g., to "0".

Hence, to the second inputs of all OR-Gates 111a, 111b, 111c of a respective ADC, due to the above inversion of the output of the registers 122a, 122b, 122c by respective inverters 123a, 123b, 123c the value "1" is provided.

Therefore, in the case of an "autonomous" ADC, the value "1" is output at the outputs of the OR-Gates 111a, 111b, 111c regardless of the state of the first inputs of the OR-Gates 111a, 111b, 111c.

As is further illustrated in FIG. 4, the outputs of the OR-Gates 111a, 111b, 111c (here: the above values "1") are provided to a second, third and fourth input of the above AND-Gate 110 of the respective ADC.

Hence, the output of the AND-Gate 110 in the case of an "autonomous" ADC only depends on the state of the first input of the AND-Gate 110, i.e., the ready signal provided by the digital part 7a of the respective "autonomous" ADC.

Therefore, in the case of an "autonomous" ADC, the ready signal received on the above line 109 is forwarded via the AND-Gate 110 to a line 120, which is connected to an input of the digital part 7a of the respective ADC.

If the digital part 7a via the line 120 receives a ready signal, it triggers the start of a conversion/parallel conversion by sending a "start" signal on a line 121 to the respective analog part 8a, 8b.

If an ADC is to be a "master" or "slave" ADC, the values stored in some or all of the registers 122a, 122b, 122c are set to a second, predefined value, e.g., to "1" for all those registers 122a, 122b, 122c associated with OR-Gates 111a, 111b, 111c connected via respective lines 108a, 108b, 108c, 108d with digital parts of ADCs of the same synchronization group, as the respective "master" or "slave" ADC.

For example, if the first ADC 3a (e.g., as a "master" ADC), and the second ADC 3b (e.g., as a "slave" ADC) are to form a synchronization group, in the register 122a of the first ADC 3a, there is to be stored a value EVALR0="1", in the register 122b, there is to be stored a value EVALR1="0", and in the register 122c, there is to be stored a value EVALR2="0".

Hence, to the second inputs of the OR-Gates 111b, 111c of the first ADC 3a, —due to the above inversion of the output of the registers 122b, 122c —the value "1" is provided, and to the second input of the OR-Gate 111a of the first ADC 3a, the value "0".

Therefore, the value "1" is output at the outputs of the OR-Gates 111b, 111c—regardless of the state of the first inputs of the OR-Gates 111b, 111c.

However, the value output at the output of the OR-Gate 111a depends on the state of the first input of the OR-Gate 111a: The output of the OR-Gate 111a only is "1" if the OR-Gate 111a via the line 108b—receives a respective start signal ready1_i from the second ADC 3b, i.e., the ADC which belongs to the same synchronization group, as the first ADC 3a.

As was explained above, the outputs of the OR-Gates 111a, 111b, 111c are provided to a second, third and fourth input of the above AND-Gate 110 of the respective ADC.

As the output of the OR-Gate 111a depends on the state of its first input, the output of the AND-Gate 110 not only depends on the state of the first input of the AND-Gate 110, i.e., whether or not a ready signal was provided by the digital part 7a of the first ADC 3a, but also on the state of the second input of the AND-Gate 110, i.e., whether or not a start signal ready1_i was provided from the second ADC 3b.

Hence, only then a ready signal is output at the output of the AND-Gate 110, and sent via the line 120 to the digital part 7a of the first ADC 3a (triggering the sending of a "start" signal from the digital part 7a to the analog part 8a) if all digital parts of the ADCs of the same synchronization group as the first ADC 3a detect that their associated analog parts are ready for a new conversion. In other words, the triggering of the start of a (parallel) conversion is controlled and synchronized by a handshake mechanism between all ADCs of the same synchronization group.

Preferably, the above values EVALR0, EVALR1, EVALR2 stored in the synchronization register 6a of a respective ADC 3a, 3b (see FIG. 2) are only taken into account/written in the above registers 122a, 122b, 122c if a synchronized, parallel conversion is to be carried out/requested by a respective "master" ADC. Otherwise, if no synchronized, parallel conversion is to be carried out, the values of the variables EVALR0, EVALR1, EVALR2 are to be ignored/not written in the above registers 122a, 122b, 122c, such that a value "1" is present at the second inputs of all OR-Gates 111a, 111b, 111c of a respective ADC, which leads to a triggering of a conversion of the respective ADC regardless of the state of the analog parts of ADCs of the same synchronization group.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
    a plurality of signal converter devices, each signal converter device is configured to variably be assigned one of several predefined roles in the system;
    each of the signal converter devices having a respective programmable register; and
    a microprocessor configured to program the respective registers to variably assign one of the predefined roles to the respective registers during normal operation of the system.

2. The system of claim 1, wherein the several predefined roles comprise the role of a master signal converter device, and the role of a slave signal converter device.

3. The system of claim 1, comprising two signal converter devices.

4. The system of claim 1, comprising more than two signal converter devices.

5. The system of claim 1, comprising more than three signal converter devices.

6. The system of claim 1, wherein the signal converter devices comprise analog-to-digital-converters.

7. The system of claim 1, additionally comprising:
    at least one bus system to connect each of the signal converter devices.

8. The system of claim 7, comprising:
    where each signal converter device is configured to send status and/or control data to all other signal converter devices in the system via the bus system.

9. The system of claim 8, each signal converter device comprising:
    wherein the programmable registers store data to define whether or not status and/or control data received from a further signal converter device in the system is to be taken into account.

10. The system of claim 8, each signal converter device comprising:
    wherein the programmable registers store data to define whether status and/or control data generated in the respective signal converter device, and/or status and/or control data generated in a further signal converter device in the system is to be taken into account.

11. A method for operating a signal converter system with several signal converter devices, comprising:

variably assigning one of several predefined roles to each of the signal converter devices by programming respective registers provided in the signal converter devices by a microprocessor during normal operation of the system.

12. The method of claim 11, comprising:

when a signal converter device is ready to carry out a conversion, sending out a signal from the first signal converter device to all other signal converter devices of the system, indicating that the first signal converter device is ready to carry out a conversion; and when a second signal converter device is ready to carry out a conversion, sending out a signal from the second signal converter device to all other signal converter devices of the system, indicating that the second signal converter device is ready to carry out a conversion.

13. The method of claim 12, additionally comprising:

starting a conversion in the first signal converter device only when the signal from the second signal converter device is received indicating that the second signal converter device is ready to carry out a conversion.

14. The method of claim 13, additionally comprising:

starting a conversion in the second signal converter device only when the signal from the first signal converter device is received indicating that the first signal converter device is ready to carry out a conversion.

15. The method of claim 14, additionally comprising:

starting a conversion in a third signal converter device of the system irrespective of whether or not the signals from the first or second signal converter devices are received indicating that the first or second signal converter devices are ready to carry out a conversion.

16. The method of claim 11, comprising:

wherein when the role of a master signal converter device was assigned to a first signal converter device of the system, and the role of a slave signal converter device was assigned to a second signal converter device of the system, a respective conversion in both the first and the second signal converter devices is carried out under control of control data provided by the first signal converter device.

17. The method of claim 16, wherein the control data is sent from the first signal converter device to all other signal converter devices of the system, but is ignored in all the signal converter devices which are not assigned the role of a slave signal converter device of the first signal converter device.

18. A system comprising:

a plurality of signal converter devices;

a plurality of registers in corresponding signal converter devices; and means for programming the respective registers during normal operation of the system to variably assign one of several predefined roles to each of the signal converter devices in the system.

* * * * *